US010746810B2

(12) United States Patent
Freiburg et al.

(10) Patent No.: US 10,746,810 B2
(45) Date of Patent: Aug. 18, 2020

(54) SWITCH APPARATUS, TEST APPARATUS AND METHOD FOR OPERATING A SWITCH APPARATUS FOR A MEASURING DEVICE FOR A TRANSFORMER

(71) Applicant: OMICRON ELECTRONICS GMBH, Klaus (AT)

(72) Inventors: Michael Freiburg, Sundern (DE); Felix Feustel, Dornbirn (AT); Horst Schedler, Rankweil (AT); Dmitry Atlas, Weiler (AT)

(73) Assignee: OMICRON ELECTRONICS GMBH, Klaus (AT)

(*) Notice: Subject to any disclaimer, the term of this patent is extended or adjusted under 35 U.S.C. 154(b) by 126 days.

(21) Appl. No.: 15/579,425

(22) PCT Filed: Jun. 9, 2016

(86) PCT No.: PCT/EP2016/063143
§ 371 (c)(1),
(2) Date: Dec. 4, 2017

(87) PCT Pub. No.: WO2016/202673
PCT Pub. Date: Dec. 22, 2016

(65) Prior Publication Data
US 2018/0143236 A1 May 24, 2018

(30) Foreign Application Priority Data
Jun. 15, 2015 (AT) .............................. A 50486/2015

(51) Int. Cl.
*G01R 15/18* (2006.01)
*G01R 29/20* (2006.01)
(Continued)

(52) U.S. Cl.
CPC ............. *G01R 31/62* (2020.01); *H01F 27/29* (2013.01); *H01F 27/402* (2013.01); *H01H 9/0005* (2013.01); *H01H 2009/0061* (2013.01)

(58) Field of Classification Search
CPC ..... G01R 31/027; H01F 27/29; H01F 27/402; H01F 29/04; H01H 9/0005; H01H 9/0016; H01H 9/0044; H02P 13/06
See application file for complete search history.

(56) References Cited

U.S. PATENT DOCUMENTS 3,083,331 A * 3/1963 Spurway ................. H01F 29/02
323/340
3,624,319 A 11/1971 Ristuccia
(Continued)

FOREIGN PATENT DOCUMENTS

CN 1126840 A 7/1996
CN 1942770 A 4/2007
(Continued)

OTHER PUBLICATIONS

International Search Report of PCT/EP2016/063143 dated Sep. 14, 2016.
Austrian Search Report dated May 23, 2016.

*Primary Examiner* — Minh N Tang
(74) *Attorney, Agent, or Firm* — Seyfarth Shaw LLP; Brian Michaelis

(57) ABSTRACT

A switch apparatus (10) for a measuring device (30) for a transformer includes controllable switch device (14) which are configured to short-circuit respectively assigned terminals (11) of one of a plurality of windings of the transformer. A test apparatus (40) including the switch apparatus (10) and a method (50) for operating the switch apparatus (10) are also disclosed. With apparatuses (10, 40) and methods (50) according to the exemplary embodiments, the work effort, (Continued)

time expenditure and errors and inaccuracies can be reduced through an automated testing of transformers.

22 Claims, 5 Drawing Sheets

(51) Int. Cl.
    *H01F 29/02*    (2006.01)
    *G01R 31/62*    (2020.01)
    *H01F 27/29*    (2006.01)
    *H01F 27/40*    (2006.01)
    *H01H 9/00*     (2006.01)

(56) References Cited

U.S. PATENT DOCUMENTS

| | | |
|---|---|---|
| 4,160,224 A | 7/1979 | Owen |
| 4,255,734 A * | 3/1981 | Owen ................. H01H 9/0005 200/11 TC |
| 4,644,111 A | 2/1987 | Hammond |
| 5,500,598 A * | 3/1996 | Ford ................... G01R 31/027 324/546 |
| 10,269,511 B2 * | 4/2019 | Baeuml ............... H01H 9/0044 |
| 2014/0210495 A1 | 7/2014 | Kondo |
| 2018/0143236 A1 | 5/2018 | Freiburg et al. |

FOREIGN PATENT DOCUMENTS

| | | |
|---|---|---|
| CN | 102253296 A | 11/2011 |
| CN | 102565562 A | 7/2012 |
| CN | 103018576 A | 4/2013 |
| CN | 103983859 A | 8/2014 |
| CN | 103018576 B | 12/2014 |
| CN | 204389590 U | 6/2015 |
| GB | 2411733 A | 9/2005 |
| RU | 2506600 C1 | 2/2014 |
| RU | 142928 U1 | 7/2014 |
| SU | 1471158 A1 | 4/1989 |
| SU | 1663581 A1 | 7/1991 |
| WO | 2009/026038 A1 | 2/2009 |
| WO | 2012155278 A1 | 11/2012 |

\* cited by examiner

SWITCH APPARATUS, TEST APPARATUS AND METHOD FOR OPERATING A SWITCH APPARATUS FOR A MEASURING DEVICE FOR A TRANSFORMER

THE FIELD OF THE INVENTION

The invention relates to a switch apparatus for a measuring device for a transformer, a test apparatus with the switch apparatus and a method for operating the switch apparatus. The invention relates in particular to such apparatuses and methods as can be used for measuring devices for voltage converters.

BACKGROUND

Transformers are used as elements of energy supply networks, for example for measuring electrical variables of high potentials, for network protection or for voltage conversion, for example for converting voltage from a first value at a high-voltage side to a second value that is smaller than the first value at a low-voltage side.

To measure the transfer behavior, for example to ensure the operational safety, or for other reasons, the determination of a plurality of characteristic magnitudes of the transformer by means of a measuring device can be necessary. Examples for such characteristic magnitudes include the determination of a winding resistance, the determination of a transformation ratio and/or the determination of a stray impedance or stray inductance of the transformer. In particular, the determination of the plurality of characteristic magnitudes comprises a plurality of individual measurements, in each of which an electrical voltage and/or an electrical current is registered and evaluated. Conclusions can, for example, be drawn from the measured characteristic magnitudes regarding the measurement accuracy (measurement or protection class) of the transformer.

An exemplary method with which different parameters of voltage converters can be determined is described in EP 2787 357 A2. The transfer accuracy of voltage converters can be determined on the basis of these parameters. A high accuracy and reproducibility in the determination of the parameters is necessary for the application of this method.

As a rule, the external circuitry (wiring configuration) of the transformer to be tested varies over the plurality of individual measurements, and this applies in particular when a so-called four-wire or four-conductor measurement method is used. A manual rewiring here can entail a high work effort and time expenditure, and lead to inaccurate or non-reproducible individual measurements. This also applies in particular to the creation of short circuits on the primary side or secondary side of the particular test object, where, depending on the test method applied at the time, such short circuits are often necessary.

SUMMARY OF THE INVENTION

There is therefore a need for apparatuses and methods which, in the context of a transformer test, effectuate an automatable change to the wiring configuration between a transformer measuring device and the transformer to be tested. There is in particular a need for such apparatuses and methods as are suitable for voltage converters that require testing.

This object is achieved according to the invention by a switch apparatus, a test apparatus, and a method. The dependent claims define preferred and/or advantageous forms of embodiment of the present invention.

According to exemplary embodiments, a switch apparatus for a measuring device for a transformer, a test apparatus with the switch apparatus, and a method for operating the switch apparatus are disclosed, being based on controllable switch means in order to be able to effectuate an automated change of the wiring configuration between the measuring device and the transformer to be tested.

With such apparatuses and methods, the work effort and time expenditure can be reduced, as can, in particular, such errors and inaccuracies in the changes of the wiring configuration between the measuring device and the transformer to be tested as can be entailed by a manual wiring with a plurality of sequential individual measurements. The measurement results can thereby be more reproducible, wherein, in addition, an increased accuracy in the test of the respective transformer can be achieved.

The present invention is preferably suitable for operation with voltage converters. Voltage converters, also known as instrument transformers or protection transformers, are for example used for floating registration of alternating voltages for energy meters or grid protection applications. The invention is not, however, restricted to this preferred field of application. The invention can, in principle, be used for any type of transformer.

The switch apparatus comprises, according to one exemplary embodiment, controllable switch means which are configured to short-circuit respectively assigned terminals of one of a plurality of windings of the transformer.

A winding of a transformer is a coil, i.e. a passive component which can be characterized primarily by an electrical inductance and, in addition, by an ohmic resistance and a parasitic capacitance.

The terminals of a winding can be ends and/or taps of the winding.

Controllable here means that The switch apparatus concerned can be operated without manual intervention. A control signal, provided to drive the respective switch means can, according to a preferred exemplary embodiment, be generated by the measuring device, so that the wiring configuration can be adapted by means of the measuring device automatically and flexibly to the respective needs and the test sequences to be carried out in the particular case, wherein the configuration of the switch apparatus, the generation and application of the respective test signal, and the tapping off and evaluation of the respective measurement signal can be coordinated centrally by the measuring device.

The switch apparatus can comprise first further controllable switch means, which are configured to supply a first electrical magnitude to be provided by the measuring device as a test signal to the transformer to a respectively assigned terminal of one of the plurality of windings.

The first electrical magnitude can be an electrical potential or an electrical current. It can be a changing magnitude or a constant magnitude.

The switch apparatus can comprise second further controllable switch means, which are configured to draw a second electrical magnitude to be registered by the measuring device as a measurement signal from a respectively assigned terminal of one of the plurality of windings.

The second electrical magnitude can also be an electrical potential or an electrical current, and may also be a changing magnitude or constant magnitude.

A difference between two electrical potentials is, here, an electrical voltage. This can be present between two terminals of a winding concerned, or one terminal of this winding and the ground potential.

The controllable switch means can, according to one form of embodiment, be configured to short-circuit respectively assigned terminals of a secondary side of the plurality of windings with a low ohmic resistance of less than 10Ω, preferably less than 1Ω and particularly preferably less than 1 mΩ. In this exemplary embodiment, the secondary-side winding corresponds in particular to a low-voltage side of the transformer which carries a low voltage.

The controllable switch means can in a further form of embodiment moreover be configured to short-circuit respectively assigned terminals of a primary side of the plurality of windings with a low ohmic resistance of less than 50% of a winding resistance of the same, preferably of less than 1Ω and particularly preferably of less than 1 mΩ. In this form of embodiment, the primary-side winding corresponds in particular to a high-voltage side of the transformer carrying a high voltage.

The controllable switch means can, moreover, be configured to double-short-circuit the respectively assigned terminals of the respective primary or secondary transformer winding. Thus, to increase reliability and product security, the corresponding short circuit can be realized, for example, through appropriate switch means in a first module, in particular a low-voltage module, and, additionally, through corresponding switch means in a second module, in particular in a high-voltage module. The possibility that a faulty short circuit can give rise to dangerous potentials in the switch apparatus is avoided in this way.

The respective transformer can, in particular, be operated as an up-converter during the measurement. A few kilovolts can thus result at the primary side from a few volts at the input. In the presence of a faulty short circuit, the kilovolts are correspondingly present at the switch matrix formed by the controllable switch means described. A transformer, connected in parallel with the short circuit, with a redundant short circuit for its part on the "other" side, can thus redundantly secure the short circuit.

The individual controllable switch means can each be power switches.

Power switches are special switches that are designed to switch a load circuit under the control of a control circuit. The controllable switch means can each be high-voltage relays, bipolar transistors with insulated control electrodes (IGBT) or field-effect transistors (FET), or can comprise these.

The plurality of windings of the transformer can also comprise partial windings.

The switch apparatus can be integrated into the measuring device, so that the switch apparatus with the signal source for the test signal, and the measurement signal evaluation unit of the measuring device, are installed in a common housing.

The switch apparatus and the measuring device can, however, also be provided in separate housings. When being used in the field, in particular in the high-voltage zone, the separate switch apparatus can be positioned in the neighborhood of the transformer to be tested, while the measuring device can be operated in the safe zone outside the high-voltage environment.

A test apparatus according to the invention comprises, according to one exemplary embodiment, a switch device according to one of the forms of embodiment described previously, and a measuring device for a transformer.

A method for operating a switch apparatus for a measuring device for a transformer comprises, according to one exemplary embodiment, the short-circuiting of respectively assigned terminals of a winding from a plurality of windings of the transformer with the aid of controllable switch means.

The method can be carried out with the switch apparatus or the test apparatus according to one of the previously described exemplary embodiments.

In particular, all of the features of the switch apparatus referred to above can accordingly be provided as analogous method features in the method.

The apparatuses and methods according to exemplary embodiments of the invention can, as described, automatically provide different wiring configurations between a transformer measuring device and a transformer to be tested. A range of advantages can be realized here. In particular, work effort and time expenditure can be reduced, as can such errors and inaccuracies in the changes of the wiring configuration between the measuring device and the transformer to be tested as can be entailed by a manual wiring with a plurality of sequential individual measurements. The measurement results can thereby become more reproducible.

In practice, transformers with a large number of different configurations are used.

The properties of the transformers correspondingly vary. The apparatuses and methods according to exemplary embodiments of the invention enable a simple testing of a wide variety of different transformers with a large number of different configurations, wherein a large measure of automation of the transformer testing is possible.

SHORT DESCRIPTION OF THE FIGURES

The invention is explained in more detail below with reference to the drawings in terms of preferred forms of embodiment.

DETAILED DESCRIPTION OF EXEMPLARY EMBODIMENTS

The present invention is explained in more detail below in terms of preferred exemplary embodiments and with reference to the drawings. The same reference signs identify identical or similar elements in the figures. The figures are schematic illustrations of various forms of embodiment of the invention. Elements illustrated in the figures are not necessarily represented to a true scale. Rather are the various elements illustrated in the figures reproduced in such a way that their function and purpose become understandable to the expert.

Connections and couplings between functional units and elements illustrated in the figures can also be implemented as indirect connections or couplings. A connection or coupling can be implemented in wired or wireless form.

Apparatuses and methods for a transformer with an arbitrary configuration are described in detail below. The transformer can, for example, be a transformer for high-voltage or medium-voltage networks. The transformer can, moreover, for example, be a transformer installed in a power station or a substation. The apparatus can be a mobile device which permits a testing to be carried out on site at an installed transformer.

Figure 1:
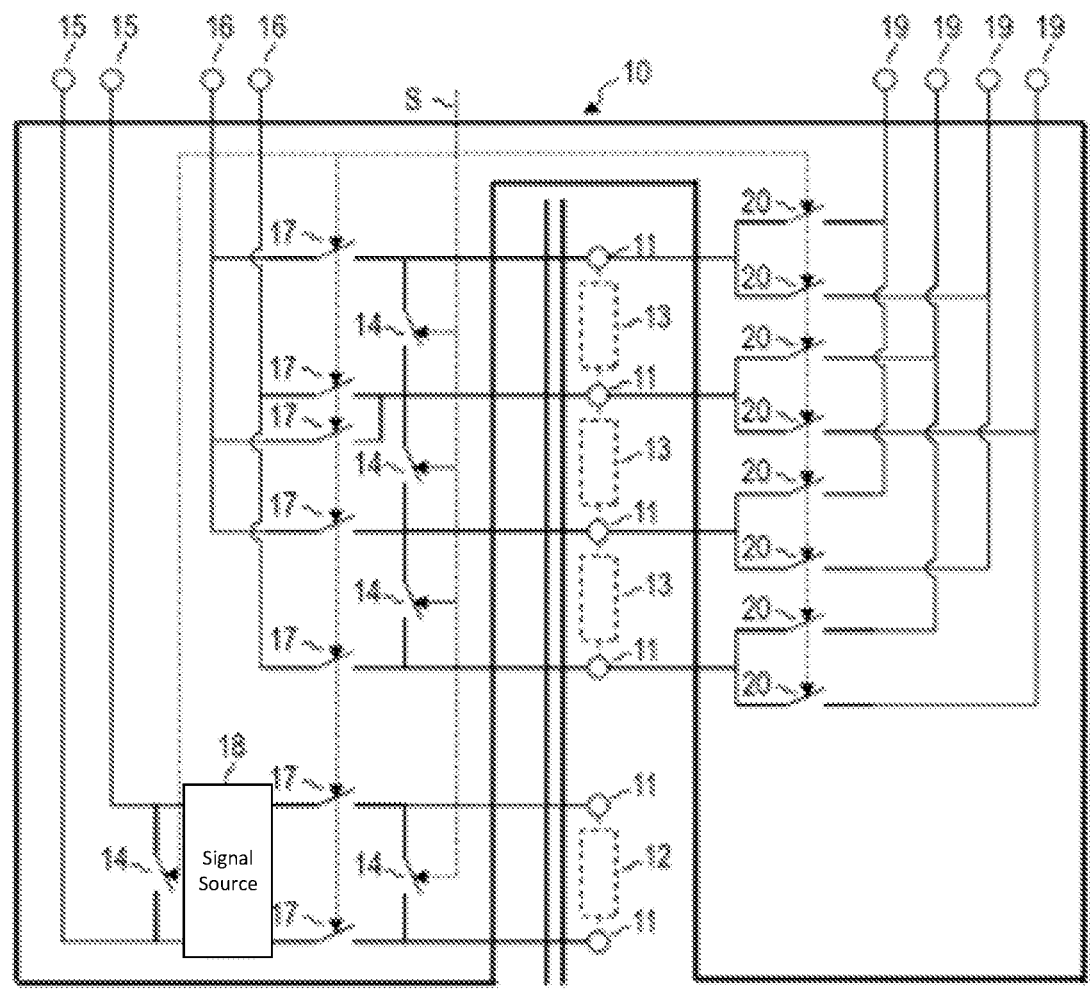
FIG. 1 shows a switch apparatus according to an exemplary embodiment.

FIG. 1 shows a switch apparatus 10 according to an exemplary embodiment.

A plurality of terminals 11 which are used to connect windings of a transformer to be tested can be seen here, brought out from the switch apparatus 10, wherein the transformer can in particular be a voltage converter, and its plurality of windings can also be partial windings.

The exemplary embodiment comprises a terminal position 12 for a primary-side winding, as well as three terminal positions 13 for a plurality of simultaneously connectable secondary-side windings. As is suggested by the two parallel vertical lines, the same magnetic flux passes, for example, through all the windings.

The switch apparatus 10 comprises controllable switch means 14 on the left-hand side of FIG. 1, which are configured to short-circuit the respectively assigned terminals 11 of one of the plurality of windings of the transformer.

In particular, the controllable switch means 14 can short-circuit the terminals 11 assigned to them with low resistance. While this can require an ohmic resistance of less than 10Ω, preferably of less than 1Ω and particularly preferably of less than 1 mΩ for secondary-side windings connected to the terminal positions 13, an ohmic short-circuit resistance of less than 50% of the winding resistance of the said transformer, preferably of less than 1Ω and particularly preferably of less than 1 mΩ is preferably to be provided to primary-side windings connected to the terminal position 12.

A plurality of terminals 15, 16 brought out of the switch apparatus 10 can be seen to the left at the top of FIG. 1. First electrical magnitudes, which in particular are currents or electrical potentials, that are to be provided can be fed as test signals, preferably by a measuring device, through these to the switch apparatus 10. In the illustrated exemplary embodiment, the terminals 15 here are terminals on the high-voltage side, whereas the terminals 16 are terminals on the low-voltage side.

In this connection, the switch apparatus 10 comprises first further controllable switch means 17, which are configured to feed the test signal made available at a respective terminal 15, 16 to a respective assigned terminal 11 of one of the plurality of windings. The terminals 11 of the secondary-side terminal positions 13 can each here be flexibly connected to one of the two terminals 16.

A block 18 is also suggested in FIG. 1, which is used to generate a high-voltage test signal. This block can be integrated into the switch device 10 or into the assigned measuring device (which is not shown in FIG. 1). It is, however, also possible, for the section 18 to be a separate component that must be appropriately connected to the measuring device and the switch apparatus 10. The block 18 can be double-short-circuited both on the side of the terminals 11 as well as, for reasons of safety, on the side of the terminals 15 by a controllable switch means 14 in each case. Accordingly, the terminals 11 that are assigned to the primary-side windings can be double-short-circuited.

A plurality of terminals 19, brought out of the switch apparatus 10, are shown on the upper right of FIG. 1. Second electrical magnitudes, which preferably are also currents or electrical voltages, can be brought through these out of the switch apparatus 10 and supplied as measurement signals to the measuring device.

For this purpose, the switch apparatus 10 comprises second further controllable switch means 20 between the terminals 11 of the secondary-side terminal positions 13 and the terminals 19, which are configured to each connect a respective assigned terminal 11 to a respective specified terminal 19. Through appropriate circuitry, the terminals 11 can each be flexibly connected to a specified one of two possible terminals 19.

The controllable switch means 14, 17 and 20 can each be power switches.

As is suggested in FIG. 1, the individual controllable switch means 14, 17, 20 can be controlled by control signals S to be made available preferably by the measuring device. In this way, variable and different test configurations can be set through these control signals S by short-circuiting the respective required windings of the object under test at the switch apparatus 10, and the test signals fed to the desired primary-side or secondary-side terminals, while the measurement signals can be accessed at the desired primary-side or secondary-side terminals.

The configuration through the measuring device is particularly advantageous here, since in this case, both the generation of the test signals and the evaluation of the measurement signals, as well as the specification of the respectively desired configuration of the switch apparatus 10 by means of the control signals S, is effected in a simple manner through one and the same unit.

Figure 2A:
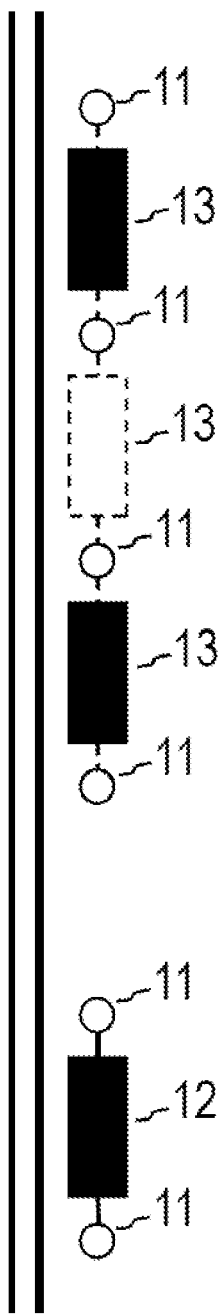
FIGS. 2A and 2B show exemplary winding terminals of a transformer to be tested at the switch apparatus of the exemplary embodiment.
Figure 2B:
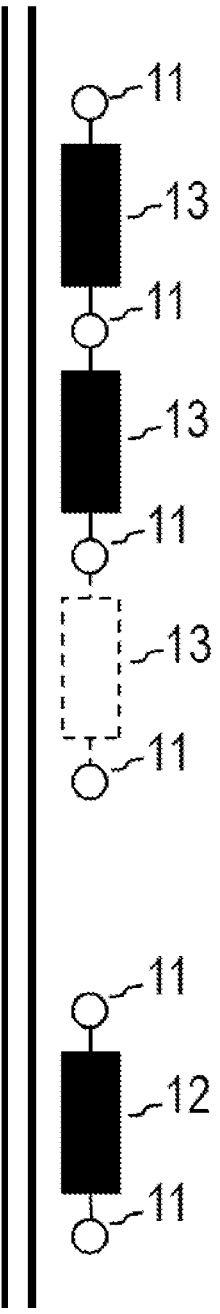

FIGS. 2A and 2B show exemplary winding terminals at the switch apparatus 10 of the exemplary embodiment of FIG. 1.

FIG. 2A illustrates exemplary winding terminals of a transformer comprising a primary-side winding and two secondary-side windings.

FIG. 2B also illustrates exemplary winding terminals of a transformer comprising a primary-side winding and two secondary-side windings. The two secondary-side windings of this transformer are in fact partial windings of a single secondary-side winding, with a tap present between the partial windings. The two partial windings accordingly share one common terminal 11.

The assignment of the terminals 11 and of the controllable switch means 14, 17 and 20 to the individual primary or secondary windings of the respective transformer in the form of embodiment illustrated in FIG. 1 and FIG. 2 is to be understood as exemplary. The design of the switch apparatus 10 is, of course, not restricted to the application case illustrated here. In principle, any arbitrary primary-side or secondary-side terminals of the transformer to be tested can be short-circuited through the controllable switch means 14. Equally, any of the test signal terminals 15, 16 can be connected to any arbitrary primary-side or secondary-side terminals of the transformer through the controllable switch means 17, while any of the measurement signal terminals 19 can be coupled to any arbitrary primary-side or secondary-side terminals of the transformer through controllable switch means 20.

Figure 3:
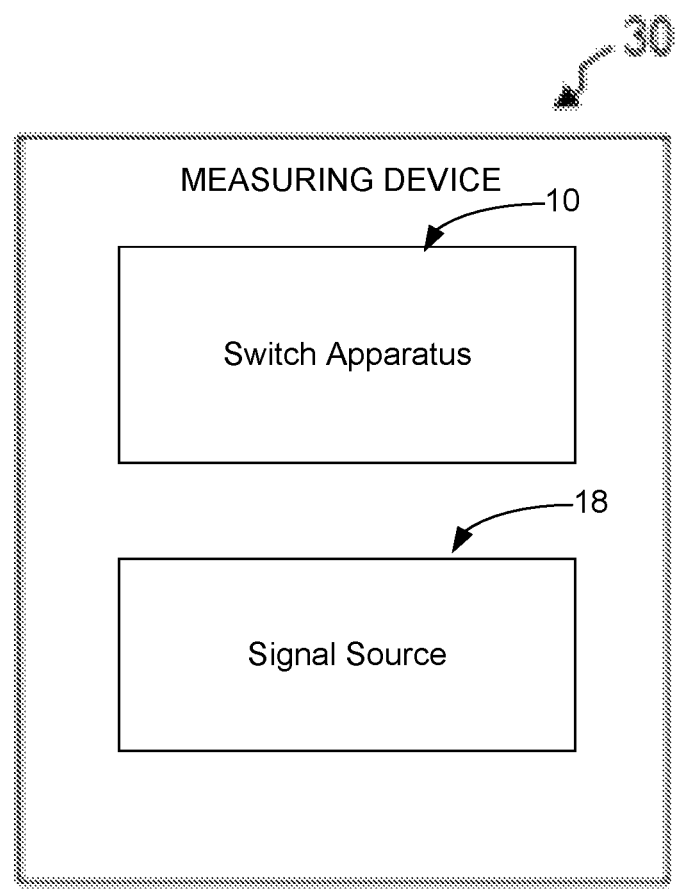
FIG. 3 shows a measuring device with a switch apparatus integrated into it according to a further exemplary embodiment.

FIG. 3 shows an exemplary embodiment in which the switch apparatus 10 is integrated into the assigned measuring device 30. In this exemplary embodiment, the measuring device 30 and the switch apparatus 10 thus share a common housing, and form a common structural unit. Sources of error, and hazards involved with the wiring between the measuring device 30 and the switch apparatus 10, can be avoided through the integration of the housings.

Figure 4:
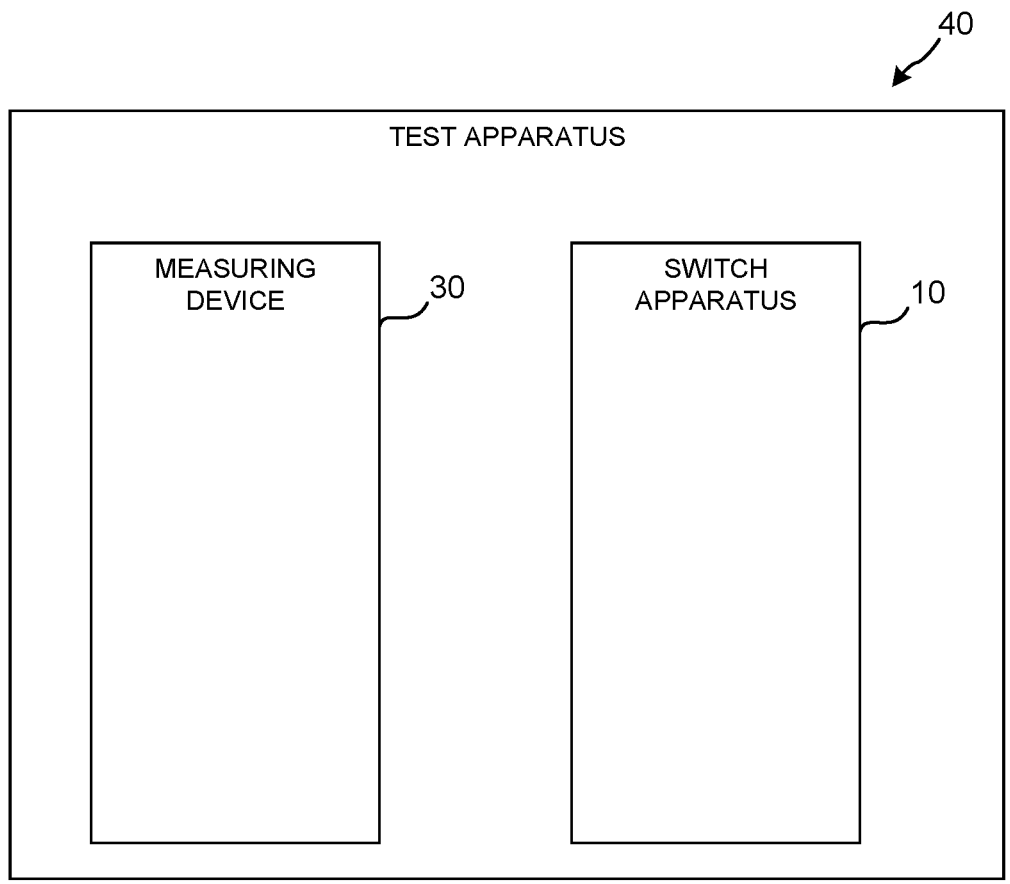
FIG. 4 shows a test apparatus according to an exemplary embodiment.

FIG. 4 shows a test apparatus 40 or test environment according to a further exemplary embodiment.

The test apparatus 40 comprises, in addition to the switch apparatus 10, the transformer measuring device 30, wherein the switch apparatus 10 and the measuring device 30 are each housed in their own housing, and thus form separate units, which can be advantageous for high-voltage applications. When being used in the field, in particular in the high-voltage zone, the separate switch apparatus 10 can in this case be positioned in the neighborhood of the transformer to be tested, while the measuring device 30 can be operated in the safe zone outside the high-voltage environment.

Figure 5:
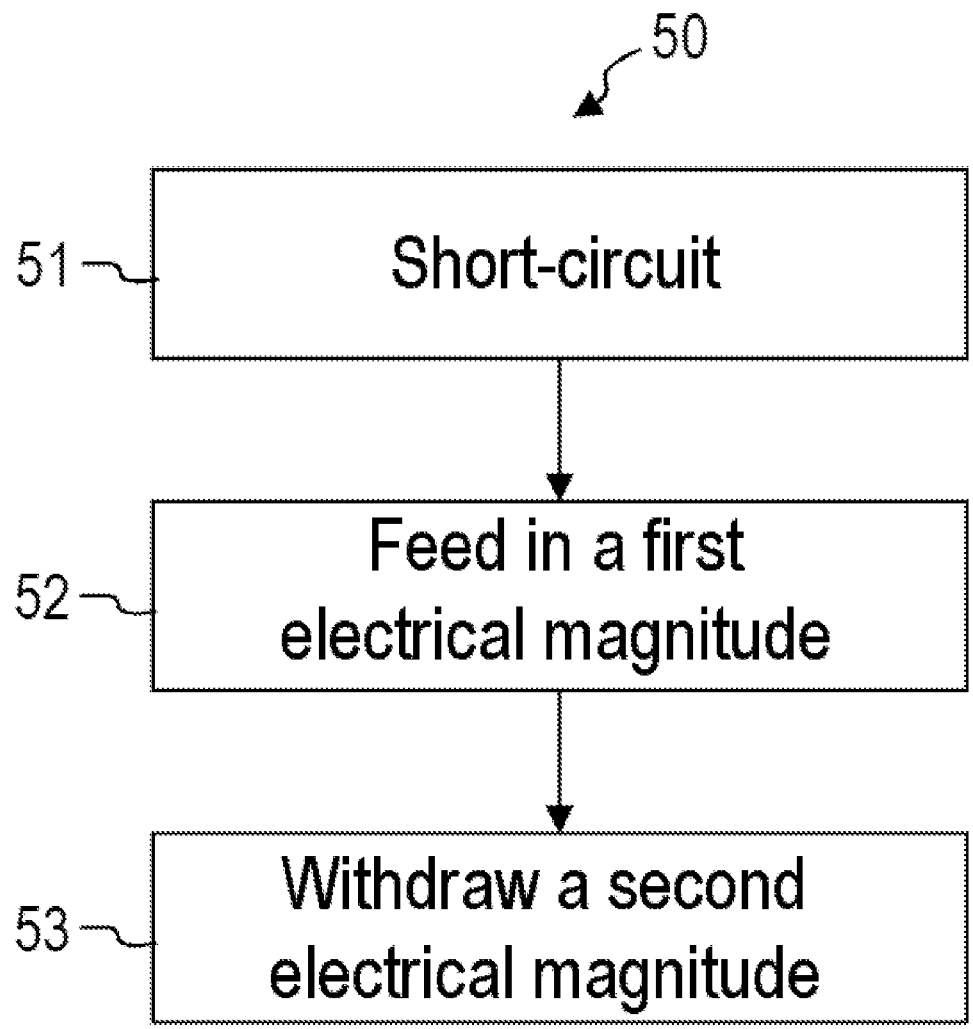
FIG. 5 shows a flow diagram of a method according to an exemplary embodiment.

FIG. 5 shows a flow diagram of a method 50 according to an exemplary embodiment.

The method 50 is used to operate a switch apparatus 10 of the type described above with a measuring device 30 for a transformer.

The method 50 uses controllable switch means 14, which are configured to short-circuit respectively assigned terminals 11 of one of a plurality of windings of the transformer. The method further employs first further controllable switch means 17, which are configured to supply a first electrical magnitude, preferably to be provided by the measuring device 30, as a test signal to a respectively assigned terminal 11 of one of the plurality of windings. In addition, the method 50 uses second further controllable switch means 20, which are configured to draw a second electrical magnitude preferably to be registered by the measuring device 30 as a measurement signal from a respectively assigned terminal 11 of one of the plurality of windings.

The method 50 comprises the following steps. In a first step 51, the respectively assigned terminals 11 of one of the plurality of windings of the transformer are short-circuited by the controllable switch means 14. In a second step 52, the first electrical magnitude is fed as a test signal to a respectively assigned terminal 11 of one of the plurality of windings, after the controllable switch means 17 have been appropriately set. In a third step 53, the second electrical magnitude is withdrawn or tapped off as a measurement signal from a respectively assigned terminal 11 of one of the plurality of windings, after the controllable switch means 20 have been appropriately set.

The method 50 can be carried out with any switch apparatus 10 according to one of the previously described exemplary embodiments, or the test apparatus 40 according to the above exemplary embodiment.

While exemplary embodiments are described in detail with reference to the figures, alternative or additional features may be used in further exemplary embodiments.

Whereas, for example, the invention is described with reference to voltage converters, the invention can generally be applied to transformers of any type.

Furthermore, the controllable switch means 14, 17 and 20 do not all have to be implemented. The advantage of the automatable configuration can already be achieved if only a few switch means of the controllable switch means 14, 17 and 20 are provided, in order thus to selectively short-circuit individual winding terminals 11 of the object under test and/or to be able to connect them selectively to a test signal output 15, 16 or a measurement signal input 19 of the measuring device.

Whereas the transformer can be installed in a power station or a substation of an energy supply network, the apparatuses and methods according to exemplary embodiments of the invention can also be employed with smaller transformers.

The controllable switch means 14, 17 and 20, and the switch matrix realized by them, can, according to a further form of embodiment, also be used to connect a plurality of windings of the object under test or transformer, in particular a plurality of secondary windings, in series. The inductance of the transformer can be "artificially" increased through this measure, which has in turn the consequence that a lower current is required for the measurement, so that a lower output power of the measuring device and switch means with smaller dimensions (e.g. smaller relays) are possible.

The invention claimed is:

1. A switch apparatus for a measuring device for a transformer, comprising:
   a signal source connected to high-voltage terminals, the signal source configured to generate a first electrical magnitude to be provided by the measuring device as a test signal to a respectively assigned terminal of one of a first plurality of windings of the transformer;
   a first controllable switch device, which is configured to short-circuit respectively assigned terminals of the one of the first plurality of windings of the transformer; and
   a second controllable switch device which is configured to interconnect at least one of a second plurality of windings of the same transformer in series with the one of the first plurality of windings of the transformer.

2. The switch apparatus as claimed in claim 1 further comprising a first further controllable switch device, which is configured to supply the test signal to the respectively assigned terminal of one of the first plurality of windings.

3. The switch apparatus as claimed in claim 2 wherein the first electrical magnitude is a voltage in the range between 0 V up to a few thousand kilovolts.

4. The switch apparatus as claimed in claim 2 wherein the first further controllable switch device are controllable by a control signal to be provided by the measuring device.

5. The switch apparatus as claimed in claim 1 further comprising a second further controllable switch device, which is configured to draw a second electrical magnitude to be detected by the measuring device as a measurement signal from a respectively assigned terminal of one of the first plurality of windings and second plurality of windings.

6. The switch apparatus as claimed in claim 5 wherein the second further controllable switch device is controllable by a control signal to be provided by the measuring device.

7. The switch apparatus as claimed in claim 1 wherein the first controllable switch device is configured to short-circuit the respectively assigned terminals of a secondary side of the first plurality of windings with an ohmic resistance of less than 10 Ω.

8. The switch apparatus as claimed in claim 1 wherein the first controllable switch device is configured to short-circuit the respectively assigned terminals of a secondary side of the first plurality of windings with an ohmic resistance of less than 1 Ω.

9. The switch apparatus as claimed in claim 1 wherein the first controllable switch device is configured to short-circuit the respectively assigned terminals of a secondary side of the first plurality of windings with an ohmic resistance of less than 1 mΩ.

10. The switch device as claimed in claim 1 wherein the first controllable switch device is configured to short-circuit the respectively assigned terminals of a primary side of the first plurality of windings with an ohmic resistance of less than 50% of a winding resistance of the transformer.

11. The switch apparatus as claimed in claim 1 wherein the first controllable switch device is configured to short-circuit the respectively assigned terminals of a primary side of the first plurality of windings with an ohmic resistance of less than 1 Ω.

12. The switch apparatus as claimed in claim 1 wherein the first controllable switch device is configured to short-circuit the respectively assigned terminals of a primary side of the first plurality of windings with an ohmic resistance of less than 1 mΩ.

13. The switch apparatus as claimed in claim 1 wherein the first controllable switch device is further configured to double-short-circuit, through a transformer, the respectively assigned terminals of the one winding.

14. The switch apparatus as claimed in claim 1 wherein each of the first and second controllable switch devices comprises a power switch.

15. The switch apparatus as claimed in claim 1 wherein the first and second controllable switch devices are controllable by a control signal to be provided by the measuring device.

16. The switch apparatus as claimed in claim 1 wherein at least one of the first plurality of the windings and the second plurality of windings of the transformer comprises at least a partial winding of the transformer.

17. The switch apparatus as claimed in claim 1 wherein the switch apparatus is configured for operation with a transformer designed as a voltage converter.

18. A test apparatus, comprising:
   a switch apparatus, comprising:
      a first controllable switch device, which is configured to short-circuit respectively assigned terminals of one of a first plurality of windings of a transformer; and
      a second controllable switch device which is configured to interconnect a second plurality of windings of the transformer in series with the first plurality of windings of the transformer; and
   a measuring device for the transformer, the measuring device comprising a signal source adapted to generate a test signal.

19. The test apparatus as claimed in claim 18,
   wherein the measuring device is adapted to feed the test signal to the switch apparatus in order to apply the test signal to the transformer through the switch apparatus; and
   wherein the measuring device is adapted to receive a measurement signal of the transformer through the switch apparatus and evaluates the measurement signal.

20. The test apparatus as claimed in claim 19 wherein the measuring device further comprises an evaluation unit for the evaluation of the measurement signal.

21. The test apparatus as claimed in claim 18 wherein the switch apparatus is integrated into the measuring device.

22. A method for operating a switch apparatus for a measuring device for a transformer, comprising the steps of:
   generating a first electrical magnitude to be provided by the measuring device as a test signal to a respectively assigned terminal of a first one of a plurality of windings
   short-circuiting respectively assigned terminals of the first one of the plurality of windings of the transformer with the aid of a first controllable switch device of the switch apparatus; and
   interconnecting at least a second of the plurality of windings of the transformer in series with the first one of the plurality of windings with the aid of a second controllable switch device of the switch apparatus.

\* \* \* \* \*